United States Patent [19]
Shen

[11] Patent Number: 6,081,120
[45] Date of Patent: Jun. 27, 2000

[54] UNIVERSAL-MULTI-LAYERED, MULTI-TUNED RF PROBE FOR MRI AND MRS

[76] Inventor: Gary G Shen, 117 Avery's Way, Cranberry Twp, Pa. 16066

[21] Appl. No.: 09/044,251

[22] Filed: May 20, 1998

[51] Int. Cl.[7] .................................................. G01V 3/00
[52] U.S. Cl. .......................................... 324/318; 600/422
[58] Field of Search ................... 324/300–322, 324/318; 600/422

[56] References Cited

U.S. PATENT DOCUMENTS

| | | |
|---|---|---|
| 4,742,304 | 5/1988 | Schnall et al. . |
| 5,424,645 | 6/1995 | Doty . |
| 5,594,338 | 6/1997 | Magnuson . |
| 5,680,047 | 10/1997 | Srinivasan et al. . |
| 5,861,748 | 1/1999 | Schaefer et al. ........................ 324/318 |

FOREIGN PATENT DOCUMENTS

WO 96/00400  1/1996  Australia .

OTHER PUBLICATIONS

Romeo Pascone et al. "Use of Transmission Line Analysis for Multi–Tuning of Birdcage Resonators." Magnetic Resonance Imaging vol. II. pp. 705–715, 1993.

J. T. Vaughan, et al. "Multiply Tuned, High Frequency Volume Coils for Clinical NMR", MRM 2nd Annul Metting, vol. 3. p.p. 1109, 1994.

G. X. Shen, et. al. "High Efficiency Double–Tuned RF Coil using a Switching Technique", MRM 2nd Annul Metting. vol. 3. pp. 1124, 1994.

RF/IF Designer's Handbook, pp. 13–6. Mini–Circuit Division of Scientific Components, Brooklyn, NY. 1992.

David K Cheng, "Field and Wave Electromagnetics", pp. 209 Addison–Wesley Publishing Co. Inc. 1983. NY.

Thulborn. et al. Absolute Molar Concentration by NMR in inhomogeneous B1: a scheme for analysis of in vivo metabolities, J. Magn. Reson. vol. 55. pp. 357–371, 1983.

SAMA As No. 5. but. pp. 202.

*Primary Examiner*—Louis Arana
*Assistant Examiner*—Tiffany A. Fetzner

[57] ABSTRACT

A universal-tuned RF probe (8) is disclosed which covers all current nuclear MRS and MRI applications and anticipates the utilization of multiple nuclides. This probe comprises a switchable thin multi-layer coil (29, 30, 31), electronically controlled switches (11, 12), an impedance matching circuit (13–20), and a resonant frequency tuning circuit (21–28). By quick switching, all different nuclei are detected independently, therefore their performances can be optimized individually. Fast switching (of less than $10^{-9}$ seconds) allows multiple frequencies to operate simultaneously. A switchable thin multi-layer coil (29, 30, 31) is used to cover a wide range of resonant frequencies and maintain identical RF B1 magnetic fields for all the different nuclei.

4 Claims, 6 Drawing Sheets

UNIVERSAL-MULTI-LAYERED, MULTI-TUNED RF PROBE FOR MRI AND MRS

BACKGROUND OF THE INVENTION

1. Field of the Invention

The present invention relates in general to magnetic resonance imaging (MRI) and magnetic resonance spectroscopy (MRS). More particularly, the present invention relates to a universal-tuned RF probe coil used to cover all the applicable nuclei utilized in nuclear magnetic resonance (NMR), such as MRI and MRS.

2. Prior Art & Background Information

A variety of nuclides, such as $^1H$, $^{31}P$, $^{13}C$, $^{19}F$, $^2H$, $^{29}Si$, $^{27}Al$, and $^{15}N$, may be studied using magnetic resonance spectroscopy (MRS) and magnetic resonance imaging (MRI). Many tools have arisen for studying these chemicals, and applications employing double nuclear resonant circuits (coils), for studying multiple nuclides simultaneously, have been used for the past 30 years. Recently, double resonant circuits have been widely used in MRI and MRS, for clinical and animal experiments.

In U.S. Pat. No. 4,742,304 Schnall disclosed a multi-tuned NMR probe using a trap-matrix approach. In order to achieve multi-tuning of the radio frequency (RF) coil, parallel LC traps were added in series with the tuning capacitor. However, the traps do not contribute to the B1 field at any resonant frequencies. To the contrary, they consume RF energy and add to coil losses, reducing overall coil performance.

A triple resonance or quad resonance NMR probe circuit was described by Doty in U.S. Pat. No. 5,424,645. This probe was designed using two double broadbanded matching networks, and claimed some of the following advantages: that it can actually be built, fit within the space allowed, and handle high power. However, to approach triple or quad RF frequencies, Doty used tank circuits whether in series, parallel or a combination thereof, as an addition to the circuitry. Thus, as in Schnall's design, the RF energy is distributed among different resonant circuits and overall coil efficiency is reduced.

The trap circuit method was also used by Romeo to create double, triple and higher order tuned birdcage volume coil designs. ("Use of Transmission Line Analysis for Mult-Tuning of Birdcage Resonators," Magnetic Resonance Imaging, pp. 705–715, 1993). However, in principle this design is the same as those presented by Schnall and Doty, and has low coil efficiency due to the energy lost in the trap circuits.

Srinivasan disclosed a multi-tuned RF coil in U.S. Pat. No. 5,680,047. In this design, two different frequencies (high or low) are created by using a co-rotating mode and a counter-rotating mode. Although this design has an advantage of not using trap or tank circuits, this design has two limitations: (1) it achieves only two resonant frequencies, and (2) B 1 field patterns are different for the different nuclei, because their current patterns are different (co-rotating mode vs. counter-rotating mode), thus co-registration of spatial data obtained from the two separate frequencies is very difficult.

Another multi-tuned RF coil design has been reported, and is based on a coaxial cavity which is tuned to the desired frequencies by adjusting the impedances of symmetrical groups of transmission line elements (see, "Multiply Tuned, High Frequency Volume Coils for Clinic NMR", Vaughan et al., p. 1119, MRM, 2nd Annual Meeting, 1994). Because all the different modes are dependent each other, the coil tuning and matching procedure would be very difficult in practice. In this design, the RF energy is consumed by the different frequencies which reduces the overall coil performance.

A double-tuned coil using a switching technique is described in "High Efficiency Double-Tuned RF Coil using a Switching Technique", Shen et al., p. 1124, MRM, 2nd Annual Meeting, 1994. This advantage in this design is its very high efficiency for both frequencies, but it is limited by covering a wide range of two frequencies. For example, the resonant frequency, 64 MHz of $^1H$ is about 10 times of 6.46 MHz of $^{15}N$ at 1.5 T. Two capacitors are required, with 100 times difference to cover these two frequencies—which is not practical, because the special non-magnetic capacitors required in MRI and MRS for covering wide ranges are not commercially available.

The switching technique has also been used for automatic tuning as described by Magnuson in U.S. Pat. No. 5,594,338. However, it is limited to a narrow tuning range of "coarse" or "fine" tune for a single-tuned coil case.

Although using a trap or tank circuit method can easily create more frequencies, the coil efficiency decreases with each additional resonant frequency. Other methods, such as designs of current modes, harmonics, or switching may also create more frequencies, but in practice they are very difficult physically implement.

No one has ever reported a radio frequency (RF) coil or probe in MRI and MRS which can cover more than 5 nuclei. Most current multi-tuned coils or probes are less than 4-tuned and have overall low efficiency. It is therefore an objective of the invention to provide a universal-tuned RF probe which can operate independently for each nuclide to optimize coil performance and overcome the previously described problems. It is also an object of this invention to employ a very thin multi-layer coil, to maintain the same B1 field patterns for all nuclei while maintaining the geometry of the coil for purposes of co-registration of data. Thus, the invention not only evaluates multiple nuclei simultaneously through a fast and efficient switching technique, but it allows the sample to be studied in the same field through utilization of the thin multi-layer coil.

SUMMARY OF THE INVENTION

The present invention is a universal-tuned radio frequency coil for use in all nuclei studied by MRI and MRS, and having the potential to replace existing single-tuned, double-tuned, and triple-tuned coils. This device can acquire important data from different, multiple nuclei in a single experiment without moving the subject and changing coils. The invention utilizes a thin, switchable muti-layer coil, combined with matching and tuning capacitors, to form a resonant circuit. Operating this apparatus allows optimization by allowing the user to choose different numbers of layers of the coil to activate, and combined with changing the tuning capacitance, it allows this device to cover a very wide range of resonant frequencies. This overcomes the limited frequency tuning range of using tuning capacitors only. The changes in inductance and capacitance can be accomplished by using electronically-controlled switches between coil layers and capacitors.

In accordance with one aspect of the present invention, using the switching technique, every nuclide in this universal-tuned probe operates individually. Thus, their performance can be optimized without energy loss due to the coupling between the different nuclei. Theoretically, each nuclide in this universal-tuned coil functions as efficiently as if in a single tuned coil.

The other principal element of this invention is the utilization of fast electronic switches. According to the specifications of commercially available fast switches, the switching time can be less than 1 nano-second ($10^{-9}$sec), which actually allows simultaneous excitation of all nuclei in MRI and MRS applications.

In accordance another aspect of the present invention, the generated B1 field patterns of all different nuclei will be identical. Although the activated number of layers in the coil may change, the geometry of the coil will remain the same in accordance with a coil design using very thin multiple layers. The identical B1 fields facilitate co-registration of spatial information for different nuclei.

The foregoing as well as other objects, features and advantages of the invention will be apparent from the following particular description of the preferred embodiments of the invention, as well as in illustrations given in the accompanying drawings.

DETAILED DESCRIPTION OF THE PREFERRED EMBODIMENTS

Figure 1:
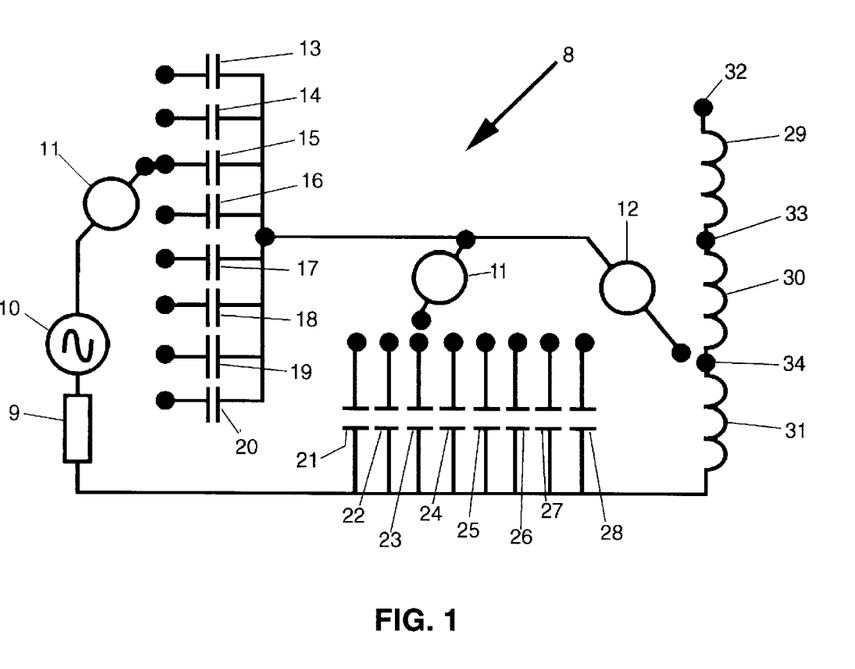
FIG. 1 is a schematic diagram of an equivalent circuit for the switchable universal-tuned RF probe.

FIG. 1 is a schematic diagram of an equivalent circuit for the preferred embodiment, a switchable universal-tuned coil (8). NMR coils, indicated at 29, 30 and 31, are connected in series at the points of (32), 33 and 34. An electronically-controlled switch 12 (the detailed circuit will be described later) is used here to switch among points 32, 33 and 34. Three coils, 29, 30 and 31 which are identical, are depicted in this embodiment although multiple coils may be employed. When switch 12 is switched to point 32, the total inductance for this resonant circuit is based on all three coils, 29, 30 and 31. Similarly, if switched to 33, the total inductance can be two of them, such as 30 and 31; and if switched to 34, the inductance is 31 only. Thus, the resonant frequency can be tuned by adjusting the number of the coils through the switching method.

Because the resonant frequency is proportional to the square root of the inductance of the resonant circuit. Two electronically-controlled switches, both depicted by 11 (the detailed circuits will be described later), are used here to switch among 8 tuning capacitors, depicted as 21, 22, 23, 24, 25, 26, 27, 28 and 8 matching capacitors, depicted as 13, 14,15, 16, 17, 18,19, 20. The number of capacitors is not limited, and can be extended if desired. All of these capacitors have different capacitance ratings in order to tune different resonant frequencies, and match to 50 ohm input impedance at different resonant frequencies. Additionally, 10 is a power source and 9 is an impedance of power source, which is 50 ohm in most MRI and MRS applications.

Figure 2:
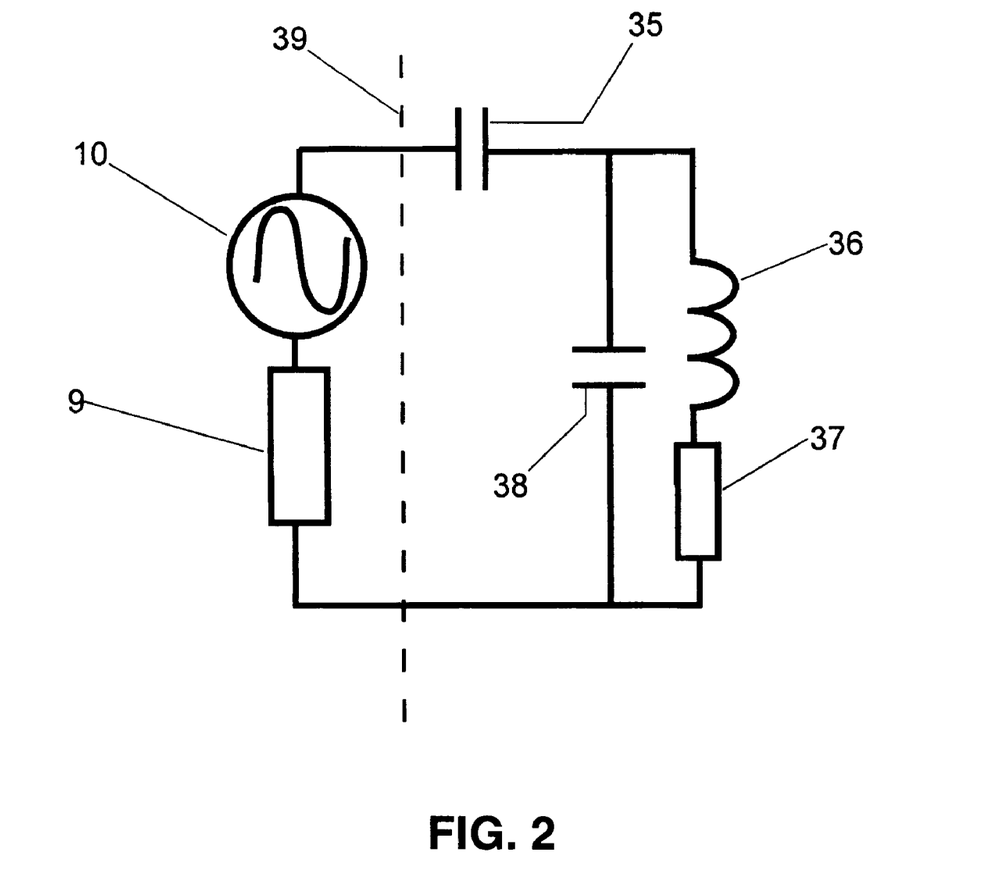
FIG. 2 is an equivalent circuit simplified from FIG. 1.

FIG. 2 is an equivalent circuit simplified from FIG. 1. Actually, in FIG. 1 only one tuning capacitance, one matching capacitance, and one inductor should be counted due to the use of the switching technique. Therefore, in FIG. 2, the matching capacitor 35 can be any one of the matching capacitors (13 through 20), the tuning capacitor 38 can be any one of the tuning capacitors (21 through 28), and the inductance 36, can be 29 alone, or 29 and 30, or 29, 30, and 31. Here, 37 is the resistance of the coil. Choosing different values for 35 (matching capacitance), 36 (inductance), and 38 (tuning capacitance), will change the expected nuclear resonant frequency to match the input impedance, 50 ohm in the left side of input impedance 39, to maximize the radio frequency probe efficiency.

Theoretically, 24 resonant frequencies can be designed by choosing among the three coils, when combined with eight selections of tuning and matching capacitance. Normally, selecting number of the coils groups the large frequency range, then select the capacitance tunes each resonant frequency in each group. Thus, a universal-tuned radio frequency probe can be designed and implemented to cover all the current existing nuclear MR applications (less than 15 nuclei have been studied to date).

Based on the presentation in FIG. 1, each nuclide in this universal-tuned probe operates independently, as shown in FIG. 2. Each nuclear performance can be optimized, and would appear the same as if measured in a conventional single-tuned coil. This invention overcomes the low efficiencies achieved by most multi-tuned coils whose energy is distributed among different nuclei. In the present invention, all nuclei can be pre-tuned and pre-matched, and the RF can be switched as required simply through an electronic controller.

Figure 3A:
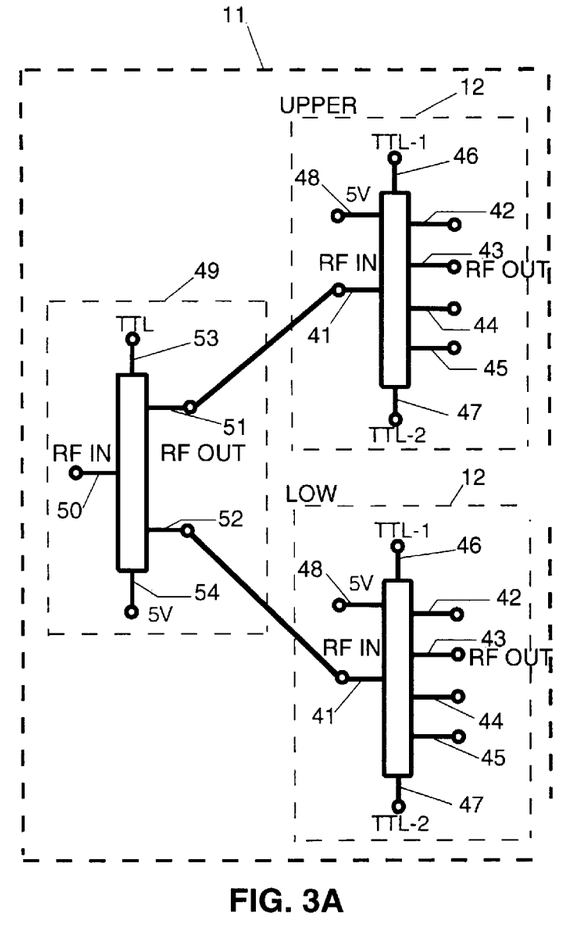
FIG. 3A is an embodiment of an electronic switch, such as the one depicted by 11 in FIG. 1.
Figure 3B:
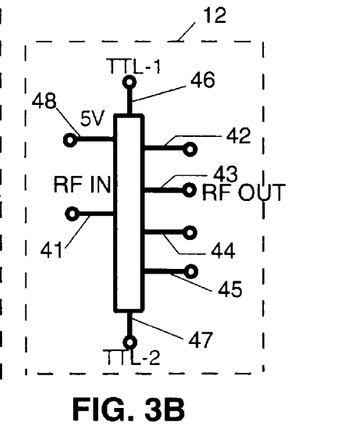
FIG. 3B is an embodiment of an electronic switch, such as the one depicted by 12 in FIG. 1.
Figure 3C:
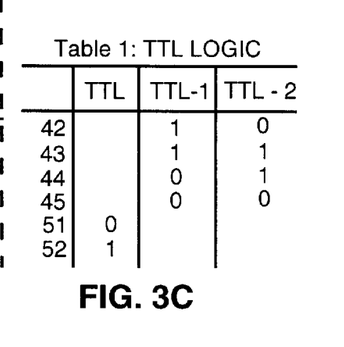
FIG. 3C is a logic table to control the switches.

FIG. 3A and FIG. 3B illustrate switches 11 and 12 respectively, which were depicted in FIG. 1. In FIG. 3A, the 8-pole switch of 11 is comprised of two 4-pole switches, given by 12, and one 2-pole switch, 49. In FIG. 3B, the 4-pole switch given by 12 actually functions as a 3-pole switch in FIG. 1. In FIG. 3A, 49 is a 2-pole switch, 54 is 5V DC bias for pin diodes in the switch, and 53 is TTL control signal (two levels: either "0" or "1"). When TTL is "0", RF IN 50 is switched to RF OUT 51, and when TTL is "1", RF IN 50 is switched to RF OUT 52 as shown in FIG. 3C. 51 and 52 are connected to RF IN 41 of the upper 4-pole switch 12, and to RF IN 41 of the low 4-pole switch of 12, respectively. 48 is 5V DC bias for pin diodes in the 4 pole switch, and 46 and 47 are TTL control signals (two levels: either "0"or "1"). RF IN 41 can be switched to any one of RF OUT 42, 43, 44 and 45 through the combination of the control signals TTL-1 46 and TTL-2 47, as shown in FIG. 3C. The low 4-pole switch of 12 functions as the same as the upper switch of 12. Thus, changing the combination of TTL 53, TTL-1 46, and TTL-2 47, RF signal can be switched to any one of 8 RF OUT (4 from the upper switch of 12 and 4 from the low switch of 12). In FIG. 3A, RF OUT, 42, 43, 44 and 45 of the upper switch of 12 are connected to matching capacitors 13, 14,15, and 16 in FIG. 1 and RF OUT, 42, 43, 44 and 45 of the low switch of 12 are connected to matching capacitors 17, 18,19, and 20 in FIG. 1. This 8-pole switch given by 11 functions the same as the matching capacitors when it used to switch the tuning capacitors, depicted by 21 to 28 in FIG. 1. The function of the switch given by 12 has been explained before, where only three RF OUT 42, 43, 44 are used to connect the points, 32, 33 and 34. The 2-pole switch of 11 and 4 pole switch of 12 are commercially available (models TOSW-230 and SP4T, Mini-Circuits Inc.). Their detailed specifications are published in their RF/IF Designer's Handbook (Mini-Circuits Division of Scientific Components, Brooklyn, N.Y.). Based on their specifications, the switches can operate up to 3,000 MHz ($3 \times 10^9$) then the switching time can be as fast as less than one nano-second ($10^{-9}$ seconds). In most NMR applications, the minimum time duration of RF pulse is about 100 ms ($100 \times 10^{-3}$ seconds). Thus, using this switching technique all nuclei in this universal-tuned coil can be excited almost simultaneously. Therefore, the economic advantage of using one broadband amplifier rather than using two, as in U.S. Pat. No. 5,424,645, or multi-broadband for simultaneous multi-nuclear operation is obvious. Alternately, they can also be operated separately in NMR applications.

Figure 4A:
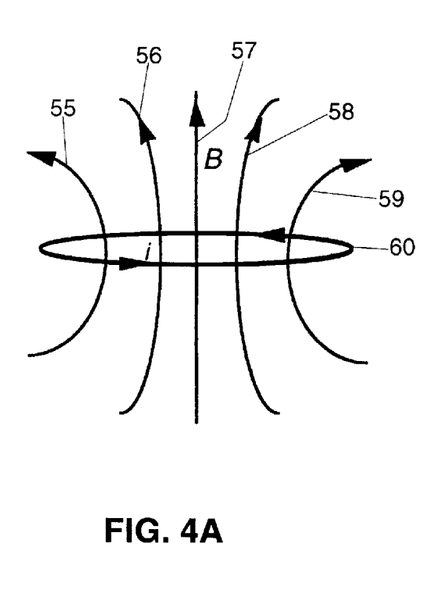
FIG. 4A illustrates the B1 field created by a single-layer RF surface coil.
Figure 4B:
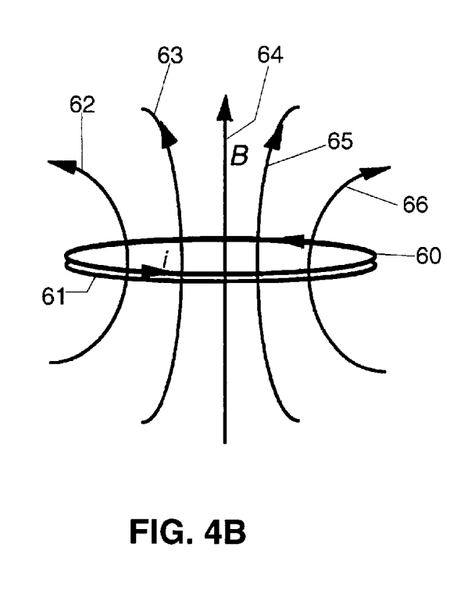
FIG. 4B illustrates the B1 field created by a very thin double-layer RF surface coil with the same diameter as the single-layer coil shown in FIG. 4A.

FIG. 4A and 4B illustrate the RF magnetic field, B1, spatial distribution created by a single-layer coil and a very thin double-layer coil, respectively. In elecromagnetics, B1 spatial distribution depends upon the coil geometry. In FIG. 4A, 55 to 59 are magnetic flux density lines, representing B1 field distributions (for simplicity, they are only drawn in two dimensions here in FIGS. 4A and 4B) created by the current i through the single layer coil 60 or double coil (61). Because the thickness of the double layer coil is very thin (0.001"to 0.003") compared with the coil dimension s for length width or diameter, typically 1 to 60 inches, the geometry of the double layer coil is almost the same as the single layer coil. According to the electromagnetic theory, the B1 spatial distributions in FIG. 4A should be the same as in FIG. 4B (page 209, Field and Wave Elecromagnetics, David K, Cheng, Addison-Wesley Publishing Company, Inc. 1983, N.Y.). In FIG. 4B, 62 to 66 should be the same as 55 to 59, respectively. 60 and 61 can be represented by 30 and 31 in FIG. 1. Thus, changing the number of coil layers can change the coil inductance (normally, it is proportional to the square of the number of coils), allowing it to cover a wide range of resonant frequencies without changing the B1 pattern. A subject (or sample) may be thereby be tested for excitation of multiple nuclei in MRS and MRI. Using the same B1 pattern to excite the subjects at all different resonances of nuclei will facilitate the spatial co-registration, and provide more information by comparing the multiple nuclide data sets (Thulborn et al., Absolute molar concentration by NMR in inhomogeneous B 1: a scheme for analysis of in vivo metabolites, J. Magn. Reson. 55, 357–371 (1983)).

Figure 5:
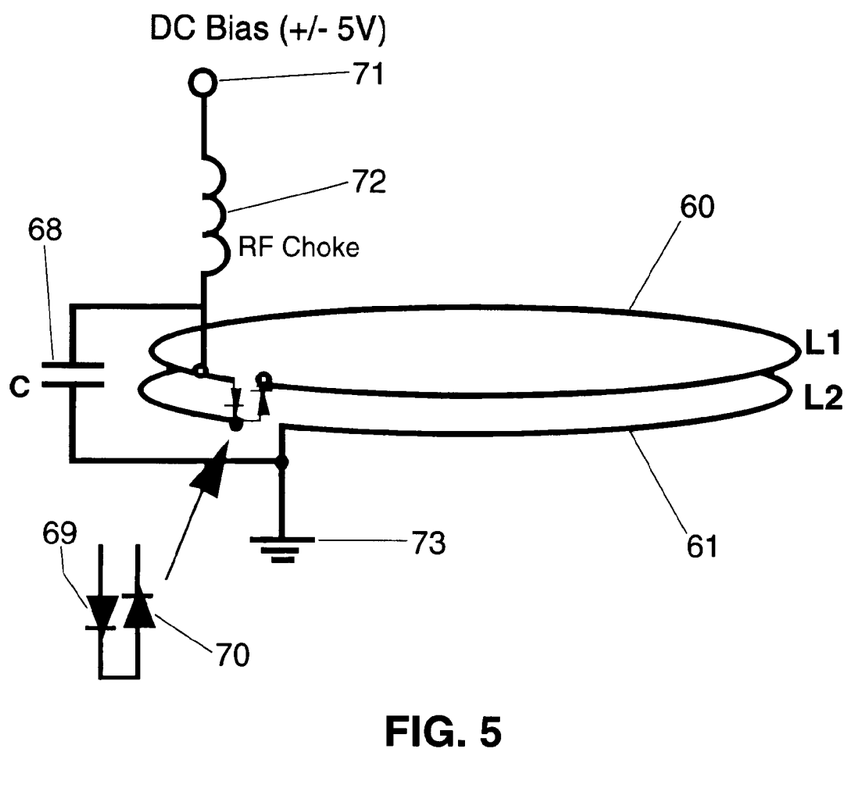
FIG. 5 illustrates how the double-layer coil can be switched to a single layer coil through the DC biased diodes.

FIG. 5 illustrates the principle of using a switch technique in a double-layer coil resonant circuit. In the resonant circuit using a double-layer coil, the electronically-controlled switch 12 can be simplified as two diodes 69 and 70 in series. The DC bias 71 is DC power source of either +5V or −5V. The RF choke 72 is used to prevent RF signal leaking from the coil to the DC power source (73). 68 is an equivalent capacitor for the resonant circuit. L1 60 is an inductor and is identical to L2 61. When the DC bias is 5 V, diode 69 is tuned on and only L2 61 functions as inductor in this resonant circuit. When DC bias is −5 V (negative 5 V), diode 69 is tuned off and 70 is on and both L1 60 and L2 61 function as two turn coils in this resonant circuit. Thus, in the second case (−5V), the resonant frequency is only a half the resonant frequency of the first case (+5V), because the inductance of the two-tune coil is four-fold of one tune coil (proportional to $N^2$, see page 202, Field and Wave Elecromagnetics, David K, Cheng, Addison-Wesley Publishing Company, Inc. 1983, N.Y.). The relationship of resonant frequency, f, and inductance, L is $f=1/(LC)^2$. Therefore, changing inductance plus changing capacitance will significantly increase the range of resonant frequency.

These double layer coils can be extended to three, four, or more layers of coil. The number of layers can be chosen through an electronic switch as exemplified by 12 in FIG. 3B a triple-layer coil. Insulation material, such as a plastic sheet or air, may be used between the layers to support and/or insulate these conductive layers, for example, a multi-layer electronic circuit board can be used in the invention. Multi-layer coils can be etched as required by geometry, and each layer may be easily supported and insulated by a dialectic material base.

Figure 6:
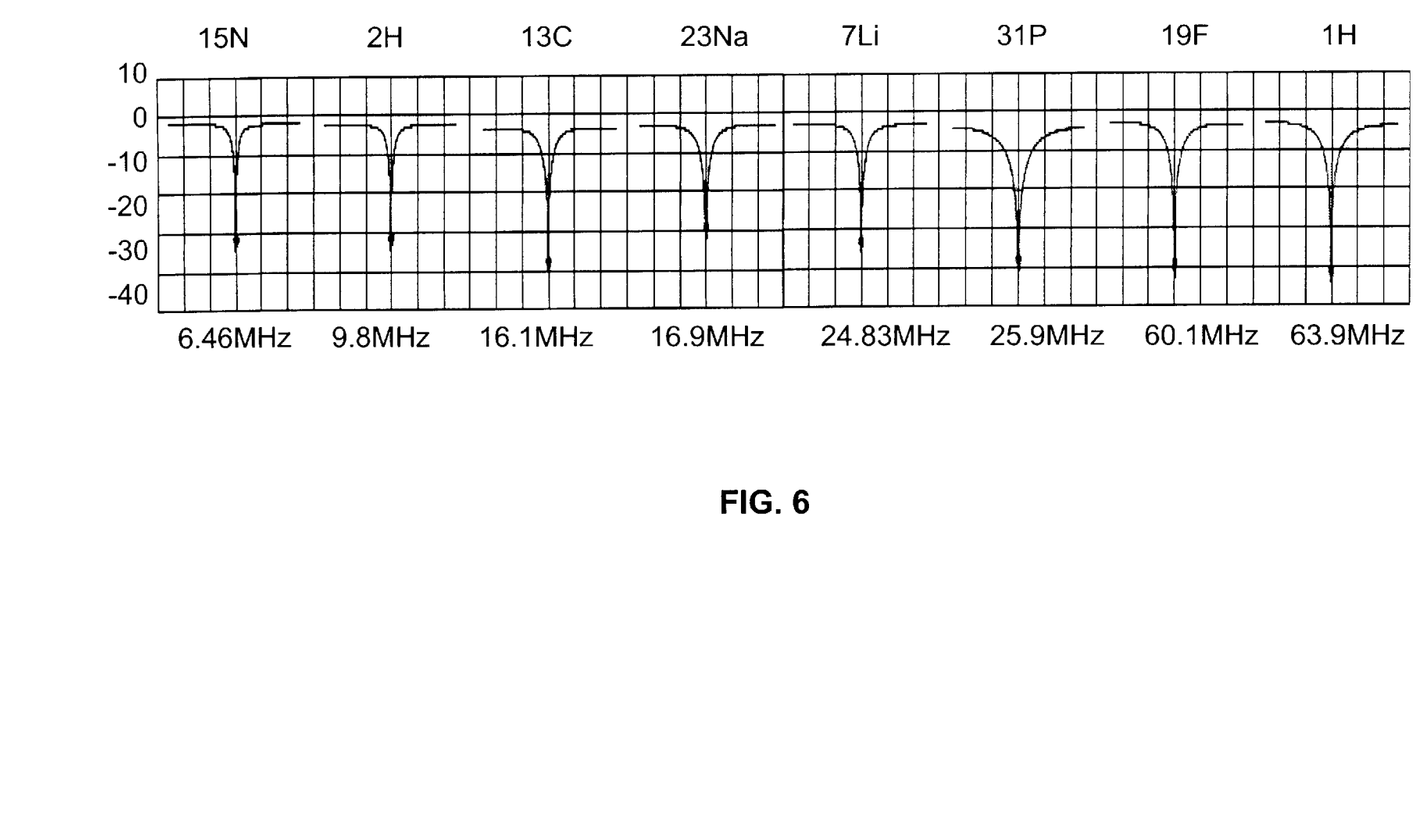
FIG. 6 presents the reflection coefficients, $S_{11}$ (dB) measured with a normal saline load from a prototype of an 8-tuned RF surface coil with a 5" diameter.

FIG. 6 illustrates the performance of a prototype of an 8-tuned (15N, 2H, 13C, 23Na, 7Li, 31P, 19F and 1H), 4" diameter, double-layer switchable surface coil. As shown in FIG. 6, all the reflection coefficients ($S_{11}$) measured in a Hewlett Packard Network Analyzer with a normal saline load are lower than −30 dB (<−15 dB is the usual specification for single tuned coil products). Normally, the deeper the reflection coefficient is, the better the coil performance, because it represents how the efficiency of the coil can absorb the energy from the signal power source. In the first group of low nuclear resonant frequencies, two layers are used; and in the second group of high nuclear resonant frequencies, only one layer is used. Number of layers are chosen based on the different frequency groups, and then each nuclear resonant frequency can be tuned and matched through the choice of different capacitors in each group.

In summary, both a novel method and apparatus for high efficiency universal-tuned RF coils have been disclosed, by using electronic switches and a thin multi-layer coil. The foregoing description of the preferred embodiments of the invention have been presented for the purposes of illustration and description. The description is not intended to be exhaustive or to limit the invention to the specifications disclosed. Many modifications and variations of the switches and coils may be possible, based on this conception.

I claim:

1. A universal multi-layered, multi-tuned RF probe coil, with substantially identical B1 field patterns for multiple nuclei, that operates independently for each nuclide examined, comprising:

(a) a thin NMR, MRI and MRS multi-layered, multi-tuned RF probe coil, that operates independently for each nuclide examined and with substantially identical B1 field patterns for multiple nuclei;

(b) a first fast electronic switch, connected to the coil in series at connection points that switches in 1 nanosecond or less, for controlling the RF coil inductance and changing the resonant frequency;

(c) an array of tuning capacitors for adjusting the resonant frequency;

(d) a second fast electronic switch, that switches in 1 nanosecond or less, to select the tuning capacitance from the array of tuning capacitors;

(e) an array of matching capacitors; and (f) a second fast electronic switch, that switches in 1 nanosecond or less, to select the matching capacitance for impedance matching.

2. The universal-tuned RF probe coil of claim 1, wherein said thin multi-layer coil comprises:

(a) multiple conductive layers, having a mean thickness of less than 3/1000 to 1/1000 of an inch of the coil's length, width, or diameter, with said layers connected to the terminals of an electronic switch; and (b) insulation between the coil layers.

3. A thin MRI, NMR, or MRS universal-multi-layered, multi-tuned RF probe coil, comprising:

(a) a thin MRI, NMR, or MRS universal-multi-layered, multi-tuned RF probe coil that operates independently for each nuclide examined, with identical B1 field patterns for multiple nuclei;

(b) said nuclear magnetic resonance coil that may be tuned to form either a surface coil or a volume coil; and (c) coil layers closely spaced to allow multiple B1 field patterns that are virtually identical.

4. A method for using a thin universal-multi-layered, multi-tuned, RF probe coil, that operates independently for each nuclide examined, with substantially identical B1 field patterns for multiple nuclei, comprising the steps of (a) choosing the number of layers of a universal-multi-layered, multi-tuned probe coil, having substantially identical B1 field patterns, for grouping resonant frequencies of multiple nuclei;

(b) selecting a tuning capacitor and matching capacitor for each-group of frequencies; and (c) transmitting a command signal using fast electronic switches, said switches switching in 1 nanosecond or less, and controlled by a TTL signal from an MR pulse sequence or an electronic remote controller.

* * * * *